United States Patent [19]

Ishikawa

[11] Patent Number: 4,764,451

[45] Date of Patent: Aug. 16, 1988

[54] IMAGE-FORMING METHOD EMPLOYING LIGHT-SENSITIVE MATERIAL CONTAINING SILVER HALIDE, REDUCING AGENT, POLYMERIZABLE COMPOUND AND A PHOTOPOLYMERIZATION INITIATOR

[75] Inventor: Shunichi Ishikawa, Minami-ashigara, Japan

[73] Assignee: Fuji Photo Film Co., Ltd., Kanagawa, Japan

[21] Appl. No.: 2,331

[22] Filed: Jan. 12, 1987

[30] Foreign Application Priority Data

Jan. 10, 1986 [JP]  Japan .................................. 61-3025

[51] Int. Cl.⁴ .............................................. G03C 1/72
[52] U.S. Cl. ................... 430/138; 430/202; 430/253; 430/254; 430/270; 430/281; 430/292; 430/913; 430/915; 430/923
[58] Field of Search ............... 430/138, 253, 254, 270, 430/281, 292, 913, 915, 923, 202

[56] References Cited

U.S. PATENT DOCUMENTS

| | | | |
|---|---|---|---|
| 4,287,290 | 9/1981 | Mizuno et al. | 430/205 |
| 4,369,249 | 1/1983 | Mizuno et al. | 430/537 |
| 4,560,637 | 12/1985 | Maeda et al. | 430/202 |
| 4,624,910 | 11/1986 | Taheda | 430/203 |
| 4,629,676 | 12/1986 | Hayakawa et al. | 430/203 |
| 4,649,098 | 3/1987 | Taheda | 430/270 |

*Primary Examiner*—Paul R. Michl
*Assistant Examiner*—Patrick A. Doody
*Attorney, Agent, or Firm*—Sughrue, Mion, Zinn, Macpeak and Seas

[57] ABSTRACT

An image-forming method which comprises:

imagewise exposing a light-sensitive material comprising a light-sensitive layer provided on a support wherein the light-sensitive layer contains silver halide, a reducing agent, a polymerizable compound and a photo-polymerization initiator;

simultaneously or thereafter developing the light-sensitive material to polymerize the polymerizable compound within the area where the latent image of the silver halide has been formed;

pressing the light-sensitive material on an image-receiving material to transfer unpolymerized polymerizable compound to the image-receiving material; and irradiating the image-receiving material with a light.

27 Claims, No Drawings

IMAGE-FORMING METHOD EMPLOYING LIGHT-SENSITIVE MATERIAL CONTAINING SILVER HALIDE, REDUCING AGENT, POLYMERIZABLE COMPOUND AND A PHOTOPOLYMERIZATION INITIATOR

BACKGROUND OF THE INVENTION

1. Field of the Invention

This invention relates to an image-forming method utilizing a light-sensitive material comprising a light-sensitive layer containing silver halide, a reducing agent and a polymerizable compound provided on a support.

2. Description of Prior Arts

Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Patent No.4,547,450) and 58(1983)-169143 describe image-forming methods utilizing light-sensitive materials comprising a light-sensitive layer containing silver halide, a reducing agent and a polymerizable compound provided on a support. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time for the operation.

An improved image forming method employing a dry process is described in Japanese Patent Provisional Publication Nos. 61(1986)-69062 and 61(1986)-73145 (the contents of both publications are described in U.S. patent Ser. No. 775,273 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441 (the content of the three publications are shown in U.S. patent Ser. No. 827,702).

The above-mentioned image forming methods are based on the principle in which the polymerizable compound is polymerized in the portion where a latent image of the silver halide has been formed.

Japanese Patent Provisional Publication No. 61(1986)-260241 (corresponding to U.S. patent Ser. No. 854,640) describes another image forming method in which the polymerizable compound in a portion where a latent image of the silver halide has not been formed is polymerized. In this method, when the material is heated, the reducing agent functions as polymerization inhibitor in the portion where a latent image of the silver halide has been formed, and the polymerizable compound in the other portion is polymerized.

Further, Japanese Patent Provisional Publication No. 61(1986)-73145 (corresponding to U.S. patent Ser. No. 775,273 and European Patent Provisional Publication No. 0174634A2) describes an embodiment of the image-forming methods which comprises: imagewise exposing a light-sensitive material comprising a light-sensitive layer provided on a support wherein the light-sensitive layer contains silver halide, a reducing agent and a polymerizable compound; simultaneously or thereafter developing the light-sensitive material; and pressing the light-sensitive material on an image-receiving material to transfer the unpolymerized polymerizable compound to the image-receiving material. According to such methods, a clear image can be formed on the image-recieving material. But, the obtained image tends to be blurred gradually under certain conditions, such as a severe preservative condition.

SUMMARY OF THE INVENTION

An object of the present invention is to provide an image-forming method in which the sharpness of the image formed on an image-receiving material can be maintained, even if the image-receiving material is preserved for a long term or under a severe condition.

There is provided by the present invention an image-forming method which comprises:

imagewise exposing a light-sensitive material comprising a light-sensitive layer provided on a support wherein the light-sensitive layer contains silver halide, a reducing agent, a polymerizable compound and a photo-polymerization initiator;

simultaneously or thereafter developing the light-sensitive material to polymerize the polymerizable compound within the area where the latent image of the silver halide has been formed (or the area where the latent image of the silver halide has not been formed);

pressing the light-sensitive material on an image-receiving material to transfer unpolymerized polymerizable compound to the image-receiving material; and irradiating the image-receiving material with a light.

There is also provided by the invention an image-forming method which comprises:

imagewise exposing a light-sensitive material comprising a light-sensitive layer provided on a support wherein the light-sensitive layer contains silver halide, a reducing agent and a polymerizable compound;

simultaneously or thereafter developing the light-sensitive material to polymerize the polymerizable compound within the area where the latent image of the silver halide has been formed (or the area where the latent image of the silver halide has not been formed);

pressing the light-sensitive material on an image-receiving material containing a photopolymerization initiator to transfer unpolymerized polymerizable compound to the image-receiving material; and irradiating the image-receiving material with a light.

The image-forming method of the invention is characterized in irradiating the image-receiving material, to which the unpolymerizable compound has been transferred, with a light in the presence of a photo-polymerization initiator.

The present inventor has found that the blurring of the obtained image (i.e., deterioration in the sharpness of the image) is caused by diffusion of the unpolymerized polymerizable compound in a liquid state or a nonsolid state which has been transferred to the image-receiving material.

In the image-forming method of the invention, the image-receiving material is irradiated with a light in the presence of a photopolymerization initiator to polymerize unpolymerized polymerizable compound. Therefore, the sharpness of the image formed on an image-receiving material according to the image-forming method of the invention can be maintained, even if the image-receiving material is preserved for a long term or under a severe condition.

DETAILED DESCRIPTION OF THE INVENTION

In the image-forming method of the present invention, various kinds of photopolymerization initiators including known compounds can be used. The nature of the photopolymerization initiator can be determined in consideration of the kind of the polymerizable compound or the condition of the image formation.

Examples of the photopolymerization initiators include $\alpha$-alkoxyphenylketones, polycyclic quinones, benzophenones, substituted benzophenones, xanthones, thioxanthones, halide compounds (e.g., chlorosulfonyl polynuclear aromatic compounds, chloromethyl polynuclear aromatic compounds, chlorosulfonylbenzophenones, chloromethylbenzophenones, fluorenones), haloalkanes, $\alpha$-halo-$\alpha$-phenylacetophenones, redox couples of a photo reducible dye and a reducing agent, paraffin halides (e.g., brominated paraffin, chlorinated paraffin), benzoyl alkyl ethers, lophine dimer-mercapto compound couples. Among them, aromatic ketones are preferred.

Concrete examples of the photopolymerization initiators include 2,2-dimethoxy-2-phenylacetophenone, 9,10-anthraquinone, benzophenone, Michler's ketone, 4,4'-diethylaminobenzophenone, xanthone, chloroxanthone, thioxanthone, chlorothioxanthone, 2,4-diethylthioxanthone, chlorosulfonylxanthone, chlorosulfonylanthraquinone, chloromethylanthracene, chloromethylbenzothiazole, chlorosulfonylbenzoxazole, chloromethylquinoline, chloromethylbenzophenone, chlorosulfonylbenzophenone, fluorenone, carbon tetrabromide, benzoin butyl ether, benzoin isopropyl ether, a combination of 2,2'-bis($\theta$-chlorophenyl)-4,4',5,5'-tetraphenylbiimidazole and 2-mercapto-5-methylthio-1,3,4-thiadiazole.

The photopolymerization initiator can be used singly or in combination of two or more compounds.

The photopolymerization initiator is preferably used in amount ranging from 0.5 to 30 weight %, more preferably 2 to 20 weight %, based on the amount of the polymerizable compound.

In the irradiation of the image-receiving material, it is necessary that the unpolymerized polymerizable compound be located in contact with or close to the photo polymerization initiator. Therefore, the image-forming method of the invention utilizes a light-sensitive material containing the photopolymerization initiator with the polymerizable compound and/or an image-receiving material containing the initiator. Even in the case that the light-sensitive material containing the photopolymerization initiator is used, the initiator can not disturb the image formation on the light-sensitive material, because the sensitivity of the photopolymerization initiator is much lower than that of silver halide which is used as a photosensor in the image formation.

There is no specific limitation with respect to the light source of the irradiation. Various light sources, such as a mercury lamp, a Xe lamp, a Xe flash lamp, and a tungsten lamp can be used in the invention. The quantity of light in the irradiation generally is larger than that of light in the following imagewise exposure.

The imagewise exposure of the light-sensitive material, the development process and the transfer of the unpolymerized polymerizable compound to the image-receiving material in the image-forming method of the invention are described below.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image-forming method described in Japanese Patent Publication No. 45(1970)-11149. The image-forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. A heating layer which is arranged on the light-sensitive material can be used as the heating means in the same manner as the light-sensitive material described in Japanese Patent Application No. 60(1985)-135568. Heating temperatures for the development process usually range from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If the nature or amount of the reducing agent is controlled, the polymerizable compound in a portion where the latent image has not been formed can be polymerized in the same manner as the light-sensitive material described in Japanese Patent Provisional Publication No. 61(1986)-260241 (corresponding to U.S. patent Ser. No. 854,640).

After the development process, the light-sensitive material is pressed on an image-receiving material to transfer the unpolymerized compound to the image-receiving material. The process for pressing can be carried out in various known manners.

After the transfer of the unpolymerized polymerizable compound, the image-receiving material is irradiated in the presence of a photopolymerization initiator to obtain a polymer image on the image-receiving material. A pigment image can be also obtained by addition of the pigment to the unpolymerized polymerizable compound before the irradiation.

In the case that the light-sensitive layer contains a color image forming substance, the color image forming substance is fixed by polymerization of the polymerizable compound. Then, by pressing the light-sensitive material in contact with the image-receiving material to transfer the color image forming substance in unfixed portions, a color image can be produced on the image-receiving material.

The image-forming method can be used for monochromatic or color photography, printing, radiography, diagnosis (e.g., CRT photography in a diagnostic device using supersonic waves), copy (e.g., a computer-graphic hard copy), etc.

The light-sensitive material and the image-receiving material which can be used for the image-forming method of the invention are described below. The photopolymerization initiator can be contained in the light-sensitive layer of the light-sensitive material and/or in the following image-receiving material.

The light-sensitive material used in the invention comprises a light-sensitive layer containing silver halide, a reducing agent and a polymerizable compound provided on a support. The thus composed material is referred hereinafter to as a "light-sensitive material".

There is no specific limitation with respect to the silver halide contained in the light-sensitive layer of the light-sensitive material.

Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed.

There is no specific limitation on the crystal habit of the silver halide grains. Two or more kinds of silver halide grains which differ in halogen composition, crystal habit, grain size, and/or other features from each other can be used in combination. There is no specific limitation on the grain size distribution of silver halide grains. The silver halide grains ordinarily have a mean size of 0.001 to 5 $\mu$m, more preferably 0.001 to 2 $\mu$m.

The total silver content (including silver halide and an organic silver salt which is one of optional component) in the light-sensitive layer preferably is in the range of from 0.1 mg/m$^2$ to 10 g/m$^2$. The silver content of the slver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining polymerization of the polymerizable compound. Examples of the reducing agents having these functions include various compounds, such as hydroquinones, catechols, p-aminophenols, p-phenylendiamines, 3-pyrazolidones, 3aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound in either a portion where a latent image of the silver halide has been formed or a portion where a latent image of the silver halide has not been formed can be polymerized. In the developing system in which the polymerizable compound in the portion where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291–334 (1977), Research Disclosure No. 17029, 9–15 (June 1978), and Research Disclosure No. 17643, 22–31 (December 1978). The reducing agents described in the these publications and applications can be employed in the light-sensitive material of the present invention. Thus, "the reducing agent(s)" in the present specification is to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Another interaction is for a chain reaction in which an oxidized state of one reducing agent formed by a reduction of silver halide (and/or an organic silver salt) induces or inhibits the polymerization of the polymerizable compound via an oxidation-reduction reaction with another reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{b 2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)- butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications and applications concerning the light-sensitive material.

Preferred polymerizable compounds employable for the light-sensitive material are compounds which are polymerizable through an addition reaction or ring-opening reaction. Preferred examples of the compounds polymerizable through the addition reaction include compounds having an ethylenic unsaturated group. Preferred examples of the compounds polymerizable through the ring-opening reaction include compounds having an epoxy group. Among them, compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl arcylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, the diacrylate of polyoxyethylenated bisphenol A, the polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and the dimethacrylate of polyoxyalkylenated bisphenol A.

The polymerizable compounds can be used singly or as a in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the abovementioned components on a support. There is no limitation with respect to the support. In the case that heat development is utilized in the use of the light-sensitive material, the material of the support preferably is resistant to heat given in the processing. Examples of the material employable for the preparation of the support include glass, paper, fine paper, coated paper, synthetic paper, metals and analogues thereof, polyester, acetyl cellulose, cellulose ester, polyvinyl acetal, polystyrene, polycarbonate, polyethylene terephthalate, and paper laminated with resin or a polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. A light-sensitive material in which the polymerizable compound is dispersed in the form of oil droplets is described in Japanese Patent Application No. 60(1985)-218603. Other components in the light-sensitive layer, such as silver halide, the reducing agent and the color image forming substance may be also contained in the oil droplets. A light-sensitive material in which silver halide is contained in the oil droplets is described in Japanese Patent Application No. 60(1985)-261888.

The oil droplets of the polymerizable compound are preferably prepared in the form of microcapsules. There is no specific limitation on preparation of the microcapsules. A light-sensitive material in which the oil droplets are present in the form of a microcapsule is described in Japanese Patent Application No. 60(1985)-117089. There is also no specific limitation on the shell material of the microcapsules and various known materials such as polymers which are employed in conventional microcapsules can be employed as the shell material. The mean size of the microcapsules preferably ranges from 0.5 to 50 μm, more preferably 1 to 25 μm, most preferably 3 to 20 μm.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substances (i.e., dyes and pigments) and non-colored or almost noncolored substances (i.e., color former or dye- or pigment-precursors) which develops to give a color under application of external energy (e.g., heating, pressing, light irradiation, etc.) or by contact with other components (i.e., a developer). A light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy include thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such an acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", 26–32 (June 19, 1980). Examples of the color formation systems specifically include a color formation system used in pressure-sensitive papers, etc., comprising a color former having a partial structure of a lactone, lactam, spiropyran, etc., and an acidic substance (developer), e.g., an acid clay, phenol, etc.; a system utilizing an azo-coupling reaction between an aromatic diazonium salt, diazotate or diazo-sulfonate and naphthol, aniline, active methylene, etc.; a system utilizing a chelating reaction, such as a reaction between hexamethylenetetramine and a ferric ion and gallic acid, or a reaction between a phenolphthalein-complex and an alkaline earth metal ion; a system utilizing an oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit a spectral sensitization effect or does not substantially adsorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion. A light-sensitive material wherein the sensitizing dye has been added during the silver halide grain formation is described in Japanese Patent Application No. 60(1985)-139746. Examples of the sensitizing dye are also described in above Japanese Patent Application No. 60(1985)-139746.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect. The light-sensitive material employing an organic silver salt is described in Japanese Patent Application No. 60(1985)-141799 (corresponding to U.S. Pat. Ser. No. 879,747).

Various image formation accelerators are employable in the light-sensitive material. The image formation accelerators function to accelerate the oxidation-reduction reaction between a silver halide (and/or an organic silver salt) and a reducing agent, function to accelerate migration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine-trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

A light-sensitive material employing base or base precursor is described in Japanese Patent Application No. 60(1985)-227528.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; and polyalkylene oxides as described in Japanese Patent Provisional Publication No. 59)1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having a $-SO_2-$ and/or $-CO-$ group described in U.S. Pat. No. 3,347,675; polar compounds as described in U.S. Pat. No. 3,667,959; and 1,10-decanediol, methyl anisate and biphenyl suberate as described in Research Disclosure 26-28 (December 1976). A light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide, inorganic peroxides, e.g., hydrogen peroxide, potassium persulfate, and ammonium persulfate; and sodium p-toluenesulfonate. The thermal polymerization initiators are preferably used in an amount of from 0.1 to 120% by weight, and more preferably from 1 to 10% by weight, based on the amount of the polymerizable compound. In a system in which the polymerizable compound located in a portion where the latent image has not been formed is polymerized, the thermal polymerization initiators are preferably incorporated into the light-sensitive layer. A light-sensitive material employing the thermal polymerization initiators is described in Japanese Patent Provisional Publication No. 61(1986)-260241 (corresponding to U.S. Ser. No. 854,640).

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium oxide or almina described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinyl pyrrolidone, and acrylamide polymers. In addition to the synthetic polymeric substances, vinyl compounds dispersed in the form of a latex, which are particularly effective to increase dimensional stability of photographic materials, can be also used. These binders can be used singly or in combination. A light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce desired image on the the image-receiving layer of the light-sensitive material. The image-receiving layer of the light-sensitive material can be constructed in the same manner as the layer of the image-receiving layer. The details of the image-receiving layer will be described later.

A light-sensitive material employing the heating layer is described in Japanese Patent Application No. 60(1985)-135568. Examples and usage of the other auxiliary layers are also described in the above-mentioned publications and applications concerning the light-sensitive material.

The light-sensitive material can be prepared, for instance, by the following process.

The light-sensitive material is usually prepared by dissolving, emulsifying or dispersing each of the components of the light-sensitive layer in an adequate medium to obtain a coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In preparation, a soluble silver salt and a halogen salt can be reacted in accordance with the single jet process, double jet process or a combination thereof. A reverse mixing method, in which grains are formed in the presence of excess silver ions, or a controlled double jet process, in which the pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provision Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dyes is preferably added during the preparation of the emulsion as described in Japanese Patent Application No. 60(1986)-139746. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion, the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as a shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive compositions can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of retaining the thus dispersed state. Further, the polymer has another function of gathering silver halide along the interface between the polymerizable compound (i.e., light-sensitive composition) and the aqueous medium in the preparation of the microcapsule. Therefore, using this polymer, silver halide can be easily introduced into the shell material of the microcapsule.

The polymerizable compound (including the light-sensitive composition) is preferably emulsified in an aqueous medium to prepare the coating solution. The necessary components for preparation of the microcapsule, such as the shell material, can be incorporated into the emulsion. Further, other components such as the reducing agent can be added to the emulsion.

The emulsion of the polymerizable compound can be processed for forming the shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins, hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsules) has been prepared by using the light-sensitive composition, the emulsion can be used as the coating solution of the light-sensitive material. The coating solution can also be prepared by mixing the emulsion of the polymerizable compound and the silver halide emulsion.

In the case that photopolymerization initiator is contained in the light-sensitive layer, the initiator is preferably incorporated into the polymerizable compound (including the light-sensitive composition) to prepare the light-sensitive material. The photopolymerization initiator can be directly added to the polymerizable compound, or dissolved in an adequate solvent prior to the addition to the polymerizable compound.

A light-sensitive material can be prepared by coating and drying the above-prepared coating solution on a support in a conventional manner.

The image-receiving material is described hereinbelow. The image forming method employing the image-receiving material or the image-receiving layer is described in Japanese Patent Provisional Publication No. 61(1986)-278849 (corresponding to U.S. patent Ser. No. 868,385).

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from compounds known in the art of conventional photography according to the kind of the color image forming substance. If desired, the image-receiving layer can be composed of two or more layers containing two or more mordants different in mordanting power from each other.

The image-receiving layer preferably contains a polymer as binder. The binder which may be employed in the above-mentioned light-receiving layer is also employable in the image-receiving layer.

In the case that the photopolymerization initiator is contained in the image-receiving material, the initiator is preferably located in the image-receiving layer.

The image-receiving layer can be composed of two or more layers according to the above-mentioned functions. The thickness of the image-receiving layer preferably ranges from 1 to 100 μm, more preferably from 1 to 20 μm.

The present invention is further described by the following examples without limiting the invention.

EXAMPLE 1

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 35 g of sodium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a,7-tetraazaindene at 60° C. The yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution containing 17 g of silver nitrate over 2 minutes. Excess salts were sedimented and removed from the resulting emulsion by pH adjustment. Thereafter, the emulsion was adjusted to a pH of 6.30 to obtain a silver benzotriazole emulsion. The yield of the emulsion was 400 g.

Preparation of light-sensitive composition

In 15 g of trimethylolpropane triacrylate were dissolved 0.06 g of the following copolymer, 1.5 g of 2,2'-dimethoxy-2-phenylacetophenone (photopolymerization initiator), 0.9 g of Pargascript Red I-6-B (produced by Ciba Geigy), 1.07 g of the following reducing agent (I) and 1.07 g of the following reducing agent (II).

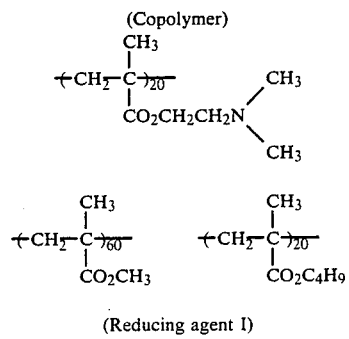

(Reducing agent I)

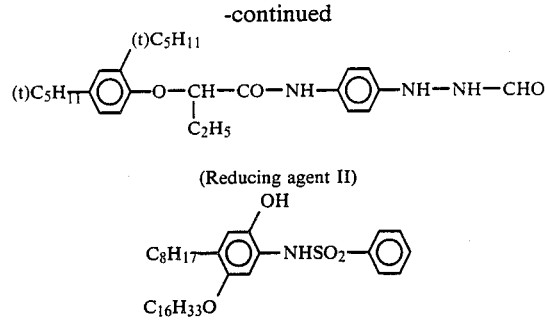

(Reducing agent II)

Further, to the resulting solution were added a mixture containing 3.5 g of the silver halide emulsion, 3.5 g of the silver benzotriazole emulsion and 0.3 g of Emulex NP-8 (tradename, preduced by Nippon Emulsion Co., Ltd.). The resulting mixture was stirred at 15,000 r.p.m. for 5 min. at 40° C. using a homogenizer to obtain a light-sensitive composition.

Preparation of light-sensitive microcapsule

To 8.2 g of 20% aqueous solution of Isovam (tradename, produced by Kuraray Co., Ltd.) was added 39 g of a 3% aqueous solution of pectin. After the solution was adjusted to a pH of 4.0 using 10% solution of sulfuric acid, the light-sensitive composition was added to the resulting solution, and the mixture was stirred at 7,000 r.p.m. for 2 min. using a homogenizer to emulsify the light-sensitive composition in the aqueous medium.

To the aqueous emulsion were added 6 g of a 40% aqueous solution of a urea, 2.5 g of 10% aqueous solution of a resorcinol and 8 g of 30% aqueous solution of formaldehyde in this order, and the mixture was heated at 60° C. for 2 hours while stirring at 1,000 r.p.m. to obtain a dispersion containing light-sensitive microcapsules.

Preparation of light-sensitive material

To 10 g of the light-sensitive microcapsule dispersion were added 0.8 g of a 20% aqueous solution of triethanolamine to prepare a coating solution. The coating solution was uniformly coated on a polyethylene-terephthalate film to form a layer having a wet thickness of 50 μm and dried to obtain a light-sensitive material containing a photopolymerization initiator in the light-sensitive layer.

Preparation of image-receiving material

To 125 g of water was added 11 g of a 40% aqueous solution of sodium hexametaphosphate, and there were further added 34 g of zinc 3,5-di-α-methylbenzylsalicylate and 82 g of a 55% slurry of calcium carbonate, followed by coarsely dispersing in a mixer. The coarse dispersion was then finely dispersed in a dynamic dispersing device. To 200 g of the resulting dispersion were added 6 g of a 50% latex of SBR (styrene-butadiene rubber) and 55 g of a 8% aqueous solution of polyvinyl alcohol, and the resulting mixture was made uniform.

The mixture was then uniformly coated on an art paper having a weight of 43 g/m² to give a layer having a wet thickness of 30 μm and dried to obtain an image-receiving material.

Image-formation on image-receiving material

The light-sensitive material was imagewise exposed to light using a tungsten lamp at 200 lux for 1 second through an original of a line work having a line width of 100 μm and then heated on a hot plate at 125° C. for 10 seconds. The exposed and heated light-sensitive material was then combined with the image-receiving material and passed through press rolls under pressure of 350 kg/cm$^2$ to obtain a clear magenta positive image on the image receiving element corresponding to the unexposed area.

The image-receiving material on which the image had been formed was fully exposed to light using an ultra high pressure mercury lamp of 200 W at a distance of 5 cm.

The obtained image had maintained the line width of 100 μm and the image was stable while the image-receiving material was left for 60 days.

It is apparent from the above result that the sharpness of the image obtained in accordance with the invention can be maintained if the image-receiving material is preserved for a long term.

COMPARISON EXAMPLE 1

Preparation of light-sensitive material

Light-sensitive material was prepared in the same manner as in Example 1 except that 2,2'-dimethoxy-2-phenylacetophenone was not used.

Image-formation on image-receiving material

An image was formed on the image-receiving material in the same manner as in Example 1 except that the above light-sensitive material was used, and the same clear magenta positive image as in Example 1 was obtained. But the line width in the obtained image had expanded from 100 μm to about 130 μm and outlines of the image were blurred gradually while the image-receiving material was left for 60 days.

EXAMPLE 2

Preparation of image-receiving material

To 125 g of water was added 11 g of a 40% aqueous solution of sodium hexametaphosphate, and there were further added 34 g of zinc 3,5-di-α-methylbenzylsalicylate and 82 g of a 55% slurry of calcium carbonate, followed by coarsely dispersing in a mixer. The coarse dispersion was then finely dispersed in a dynamic dispersing device. To 200 g of the resulting dispersion were added 6 g of a 50% latex of SBR (styrene-butadiene rubber) and 75 g of an emulsion in which 20 g of a methylene chloride solution containing 5 g of 2,2'-dimethoxy-2-phenylacetophenone (photopolymerization initiator) was emulsified in 55 g of a 8% aqueous solution of polyvinyl alcohol, and the resulting mixture was made uniform.

The mixture was then uniformly coated on an art paper having a weight of 43 g/m$^2$ to give a layer having a wet thickness of 30 μm and dried to obtain an image-receiving material containing a photo polymerization initiator.

Preparation of light-sensitive material

Light-sensitive material was prepared in the same manner as in Example 1 except that 2,2'-dimethoxy-2-phenylacetophenone was not used.

Image-formation on image-receiving material

An image was formed on the image-receiving material in the same manner as in Example 1 except that the above image-receiving material and the light-sensitive material were used, and the same clear magenta positive image as in Example 1 was obtained.

The image-receiving material on which the image had been formed was fully exposed to light using an ultra high pressure mercury lamp of 200 W at a distance of 5 cm.

The obtained image maintained the line width of 100 μm and the image was stable while the image-receiving material was left for 60 days.

What is claimed is:

1. An image-forming method which comprises:
    imagewise exposing a light-sensitive layer provided on a support wherein the light-sensitive layer contains silver halide, a reducing agent, a polymerizable compound and a photopolymerization initiator, said reducing agent and said photopolymerization initiator being different from each other;
    simultaneously or thereafter developing the light-sensitive material to polymerize the polymerizable compound within the area where the latent image of the silver halide has been formed;
    pressing the light-sensitive material on an image-receiving material to transfer unpolymerized polymerizable compound and the photopolymerization initiator to the image-receiving material; and
    irradiating the image-receiving material with a light.

2. The image-forming method as claimed in claim 1, wherein the develpment is done by a heat development process.

3. The image-forming method as claimed in claim 1, wherein the image-receiving material is previously provided on the light-sensitive material as an image-receiving layer.

4. The image-forming method as claimed in claim 1, wherein the photopolymerization initiator is an aromatic ketone.

5. The image-forming method as claimed in claim 1, wherein the photopolymerization initiator is contained in the light-sensitive layer in an amount of from 0.5 to 30 weight % based on the amount of the polymerizable compound.

6. An image-forming method which comprises:
    imagewise exposing a light-sensitive material comprising a light-sensitive layer provided on a support wherein the light-sensitive layer contains silver halide, a reducing agent, a polymerizable compound and a photopolymerization initiator, said reducing agent and said photopolymerization initiator being different from each other;
    simultaneously or thereafter developing the light-sensitive material to polymerize the polymerizable compound within the area where the latent image of the silver halide has not been formed;
    pressing the light-sensitive material on an image-receiving material to transfer unpolymerized polymerizable compound and the photopolymerization initiator to the image-receiving material; and
    irradiating the image-receiving material with a light.

7. The image-forming method as claimed in claim 6, wherein the develpment is done by a heat development process.

8. The image-forming method as claimed in claim 6, wherein the image-receiving material is previously provided on the light-sensitive material as an image-receiving layer.

9. The image-forming method as claimed in claim 6, wherein the photopolymerization initiator is an aromatic ketone.

10. The image-forming method as claimed in claim 6, wherein the photopolymerization initiator is contained in the light-sensitive layer in an amount of from 0.5 to 30 weight % based on the amount of the polymerizable compound.

11. An image-forming method which comprises:
imagewise exposing a light-sensitive material comprising a light-sensitive layer provided on a support wherein the light-sensitive layer contains silver halide, a reducing agent and a polymerizable compound;
simultaneously or thereafter developing the light-sensitive material to polymerize the polymerizable compound within the area where the latent image of the silver halide has been formed;
pressing the light-sensitive material on an image-receiving material containing a photopolymerization initiator to transfer unpolymerized polymerizable compound to the image-receiving material, said reducing agent and said photopolymerization initiator being different from each other; and
irradiating the image-receiving material with a light.

12. The image-forming method as claimed in claim 11, wherein the develpment is done by a heat development process.

13. The image-forming method as claimed in claim 11, wherein the image-receiving material is previously provided on the light-sensitive material as an image-receiving layer.

14. The image-forming method as claimed in claim 11, wherein the photopolymerization initiator is an aromatic ketone.

15. The image-forming method as claimed in claim 11, wherein the photopolymerization initiator is contained in the image-receiving material in an amount of from 0.5 to 30 weight % based on the amount of the polymerizable compound.

16. An image-forming method which comprises:
imagewise exposing a light-sensitive material comprising a light-sensitive layer provided on a support wherein the light-sensitive layer contains silver halide, a reducing agent and a polymerizable compound;
simultaneously or thereafter developing the light-sensitive material to polymerize the polymerizable compound within the area where the latent image of the silver halide has not been formed;
pressing the light-sensitive material on an image-receiving material containing a photopolymerization initiator to transfer unpolymerized polymerizable compound to the image-receiving material, said reducing agent and said photopolymerization initiator being different from each other; and
irradiating the image-receiving material with a light.

17. The image-forming method as claimed in claim 16, wherein the develpment is done by a heat development process.

18. The image-forming method as claimed in claim 16, wherein the image-receiving material is previously provided on the light-sensitive material as an image-receiving layer.

19. The image-forming method as claimed in claim 16, wherein the photopolymerization initiator is an aromatic ketone.

20. The image-forming method as claimed in claim 16, wherein the photopolymerization initiator is contained in the image-receiving material in an amount of from 0.5 to 30 weight % based on the amount of the polymerizable compound.

21. A light-sensitive material comprising a light-sensitive layer provided on a support wherein the light-sensitive layer contains silver halide, a reducing agent, a polymerizable compound and a photopolymerization initiator, said reducing agent and said photopolymerization initiator being different from each other.

22. The light-sensitive material as claimed in claim 21, wherein the light-sensitive layer further contains a color image forming substance.

23. The light-sensitive material as claimed in claim 21, wherein the polymerizable compound is dispersed in the light-sensitive layer in the form of oil droplets, and silver halide and the photo polymerization initiator are contained in the oil droplets.

24. The light-sensitive material as claimed in claim 21, wherein the polymerizable compound is contained in microcapsules which are dispersed in the light-sensitive layer, and silver halide and the photo polymerization initiator are contained in the microcapsules.

25. The light-sensitive material as claimed in claim 21, wherein an image-receiving layer is provided on the light-sensitive layer.

26. The light-sensitive material as claimed in claim 21, wherein the photopolymerization initiator is an aromatic ketone.

27. The light-sensitive material as claimed in claim 21, the photopolymerization initiator is contained in an amount of from 0.5 to 30 weight % based on the amount of the polymerizable compound.

* * * * *